United States Patent
Okamoto

(10) Patent No.: US 7,274,248 B2
(45) Date of Patent: Sep. 25, 2007

(54) BOOSTER CIRCUIT AND SEMICONDUCTOR DEVICE HAVING SAME

(75) Inventor: Toshiharu Okamoto, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 15 days.

(21) Appl. No.: 11/071,217

(22) Filed: Mar. 4, 2005

(65) Prior Publication Data

US 2005/0195019 A1 Sep. 8, 2005

(30) Foreign Application Priority Data

Mar. 8, 2004 (JP) .............................. 2004-063898

(51) Int. Cl.
*G05F 1/10* (2006.01)
(52) U.S. Cl. ...................... 327/536; 327/537
(58) Field of Classification Search ........ 327/535–537; 365/59–60
See application file for complete search history.

(56) References Cited

U.S. PATENT DOCUMENTS

| 4,962,512 | A | * | 10/1990 | Kiuchi | 377/78 |
| 5,767,735 | A | * | 6/1998 | Javanifard et al. | 327/536 |
| 5,969,565 | A | * | 10/1999 | Naganawa | 327/536 |
| 6,154,411 | A | * | 11/2000 | Morishita | 365/226 |
| 6,486,728 | B2 | * | 11/2002 | Kleveland | 327/536 |
| 6,597,235 | B2 | * | 7/2003 | Choi | 327/536 |
| 6,816,001 | B2 | * | 11/2004 | Khouri et al. | 327/536 |

FOREIGN PATENT DOCUMENTS

JP 2003-244940 8/2003

* cited by examiner

*Primary Examiner*—Dinh T. Le
(74) *Attorney, Agent, or Firm*—Young & Thompson

(57) ABSTRACT

A booster circuit for boosting an externally supplied voltage includes a plurality of parallel-connected charge pump units. The charge pump units are activated successively in accordance with a boosted voltage to suppress peak current at start-up of the booster circuit and reduce fluctuation of power supply voltage.

13 Claims, 6 Drawing Sheets

BOOSTER CIRCUIT AND SEMICONDUCTOR DEVICE HAVING SAME

FIELD OF THE INVENTION

This invention relates to a booster circuit for boosting power supply voltage supplied from an external source and generating a boosted voltage, and to a semiconductor device equipped such booster circuits.

BACKGROUND OF THE INVENTION

Conventionally, a semiconductor device such as a flash memory or dynamic memory is such that the voltage necessary for internal operation is generated within the semiconductor device so that such operations as write, read and erase of stored content may be performed. To accomplish this, the semiconductor device is provided internally with a booster circuit that includes charge pump units. A problem encountered, however, is a large peak consumption current that develops in the booster circuit at the time of start-up and a power supply voltage that fluctuates. Many improvements have been made heretofore.

An example of such an improvement is to reduce the voltage amplitude of a boot-up signal immediately after input of the start-up signal of the booster circuit and then enlarge the voltage amplitude of the boot-up signal upon elapse of a fixed period of time measured by a timer circuit, thereby suppressing peak consumption current at start-up of the booster circuit (see FIGS. 1 and 5 in the specification of Japanese Patent Kokai Publication No. JP-P2003-244949A).

FIG. 8 illustrates another example of the prior art. This example comprises charge pump units 1, 2, 3, 4 each having a clock buffer and charge pump circuit, a clock generating circuit 5, a capacitor 8, dividing unit 19 for dividing boosted voltage, and, comparison unit 10. A boosted voltage Vpp is output to an output terminal 9, whence the voltage is supplied to a booster circuit load 20 within a semiconductor device.

Operation will be described with reference to FIG. 8. If a booster circuit activating signal TACT that enters from a terminal 6 is activated and a divided booster voltage VDIV0 obtained by dividing the boosted voltage Vpp is smaller than a reference voltage VREF, then the clock generating circuit 5 generates a clock pulse in response to a clock generation control signal, which is the output of the comparison unit 10. A clock pulse 51 is supplied to clock buffer #1 of the charge unit 1, whereby charge pump circuit #1 starts boosting voltage.

The clock generating circuit 5 successively generates clock pulses 52, 53, 54 of different phases and supplies these pulses to clock buffers #2, #3, #4, respectively, whereby all of the charge pump units 2, 3, 4 start a voltage boosting operation in sync with respective ones of these clock pulses of different phases. If the divided booster voltage VDIV0 is greater than the reference voltage VREF, then the clock generating circuit 5 stops supplying clock pulses, thereby halting the boosting operation of all of the charge pump units.

In general, the current supply capability of a charge pump is proportional to the clock-pulse cycle. If the clock pulses are high in speed, then the current supply capability is high. Generally speaking, in order to assure a sufficiently high current supply capability without increasing the area of a booster circuit, use is made of clock pulses of higher speed, e.g., a pulse cycle on the order of tens of nanoseconds.

Merely making the phases of these clock pulses different from one another cannot assure that the phase difference necessary to suppress fluctuation of the power supply voltage will be obtained. Accordingly, even if ripple of the power supply voltage can be mitigated merely by making the phases of the clock pulses different from one another, this will not be sufficient to suppress peak current at start-up of the booster circuit and to suppress fluctuation of the power supply voltage.

[Patent Publication 1]
JP Patent Kokai Publication No. JP-P2003-244940A

SUMMARY OF THE DISCLOSURE

Modern semiconductor devices are strongly required to run on lower power supply voltages and at higher speeds. The booster circuits used internally to achieve higher speeds necessitate a large number of pump stages for charge pump units, a large number of parallel connections for the charge pump units required and higher clock frequency to achieve operation. As a result, peak current at start-up of the booster circuit increases further and so does fluctuation of the power supply voltage.

With the above-described method of staggering the phases of the clock pulses, a satisfactory phase lag cannot be set. A problem which 3arises is that peak current at start-up and fluctuation of the power supply voltage cannot be controlled.

Accordingly, an object of the present invention is to provide a booster circuit in which by controlling start-up of charge pump units in accordance with boosted voltage, peak consumption current of the booster circuit is suppressed and efficiency of consumed current with respect to boosted voltage is improved, as well as a semiconductor device equipped with such booster circuits.

According to a first aspect of the present invention, there is provided a booster circuit for boosting an externally supplied voltage, comprising a plurality of parallel-connected charge pump units activated successively in accordance with a boosted voltage generated internally.

The booster circuit of the present invention further comprises a plurality of comparison units, wherein each of the plurality of comparison units compares a reference voltage and a divided boosted voltage obtained by dividing the boosted voltage, thereby successively activating the plurality of charge pump units.

In the booster circuit of the present invention, the divided boosted voltages are obtained by voltage-dividing the boosted voltage using resistors. Furthermore, a transistor is provided between a plurality of resistors, which are connected in series between the boosted voltage and ground voltage, and the ground voltage, the transistor being turned on and off by result of the comparison by the comparison units.

In the booster circuit of the present invention, the transistor is placed in the off state by the result of the comparison by the comparison units, thereby continuing the activated state of a charge pump control signal.

In the booster circuit of the present invention, at least one of the plurality of comparison units controls operation of a clock generating circuit, thereby controlling operation of at least one charge pump units among the plurality of charge pump units, and the other comparison units successively activate the other charge pump units.

According to a second aspect of the present invention, there is provided a booster circuit for boosting an externally supplied voltage, comprising a plurality of parallel-connected charge pump units and a charge pump units control unit for controlling the number of the charge pump units that will operate in accordance with a boosted voltage.

In the booster circuit according to this aspect of the invention, slope of the boosted voltage when the boosted voltage is low differs from that when the boosted voltage is high, with the slope being small when the boosted voltage is low and large when the boosted voltage is high.

According to a third aspect of the present invention, there is provided a booster circuit for boosting an externally supplied voltage, comprising a plurality of parallel-connected charge pump units, wherein voltage is boosted by a small number of the charge pump units when a boosted voltage is low and, as the boosted voltage rises, by a number of the charge pump units greater than a number when the boosted voltage is low.

Further, according to the present invention, the foregoing object is attained by providing a semiconductor device equipped with a booster circuit having the characterizing features described above.

The meritorious effects of the present invention are summarized as follows.

The present invention is capable of providing a booster circuit in which by successively activating a plurality of charge pump units in accordance with a boosted voltage by monitoring the boosted voltage, peak consumption current is suppressed and each of the charge pump units is operated in a state in which the efficiency of consumed current with respect to the boosted voltage is high. The present invention also provides an ideal semiconductor device equipped with such booster circuits.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Preferred embodiments of a booster circuit according to the present invention and a semiconductor device equipped with this booster circuit will be described in detail with reference to FIGS. 1 to 7.

First Embodiment

Figure 1:
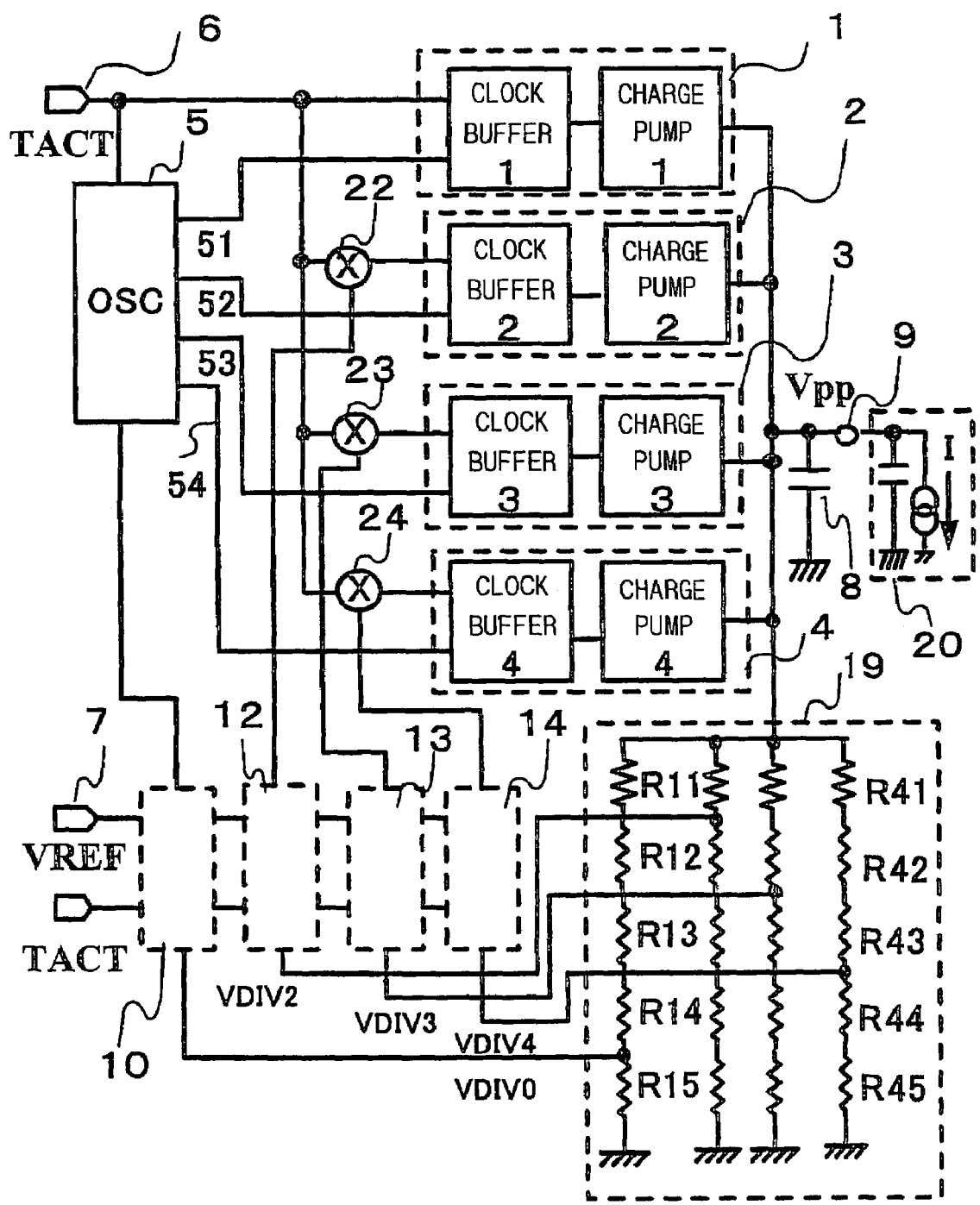
FIG. 1 is a circuit block diagram illustrating a booster circuit according to a first embodiment of the prior art.
Figure 2:
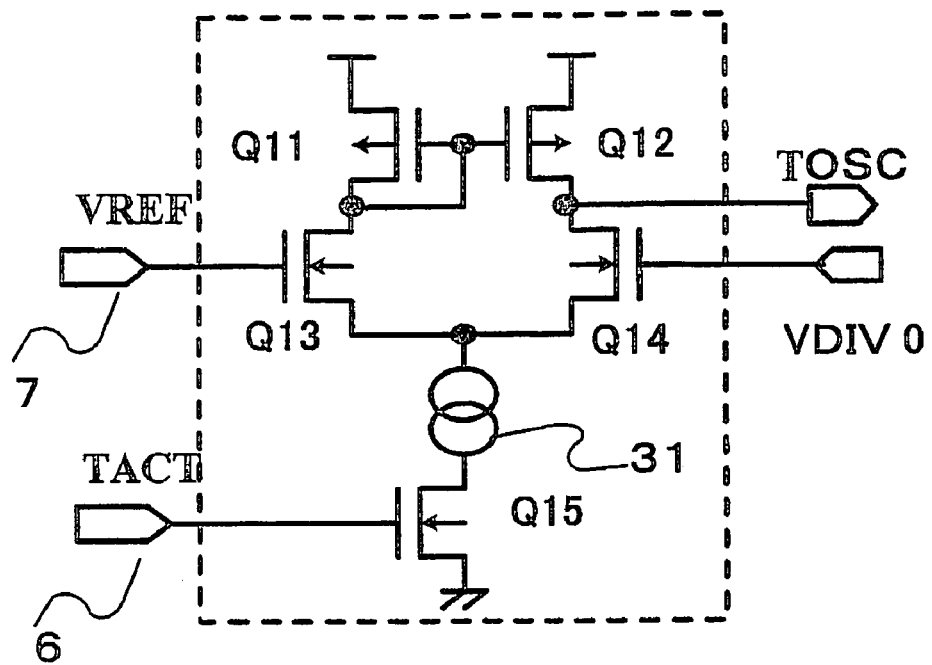
FIG. 2 is a circuit diagram of first comparison unit.
Figure 3:
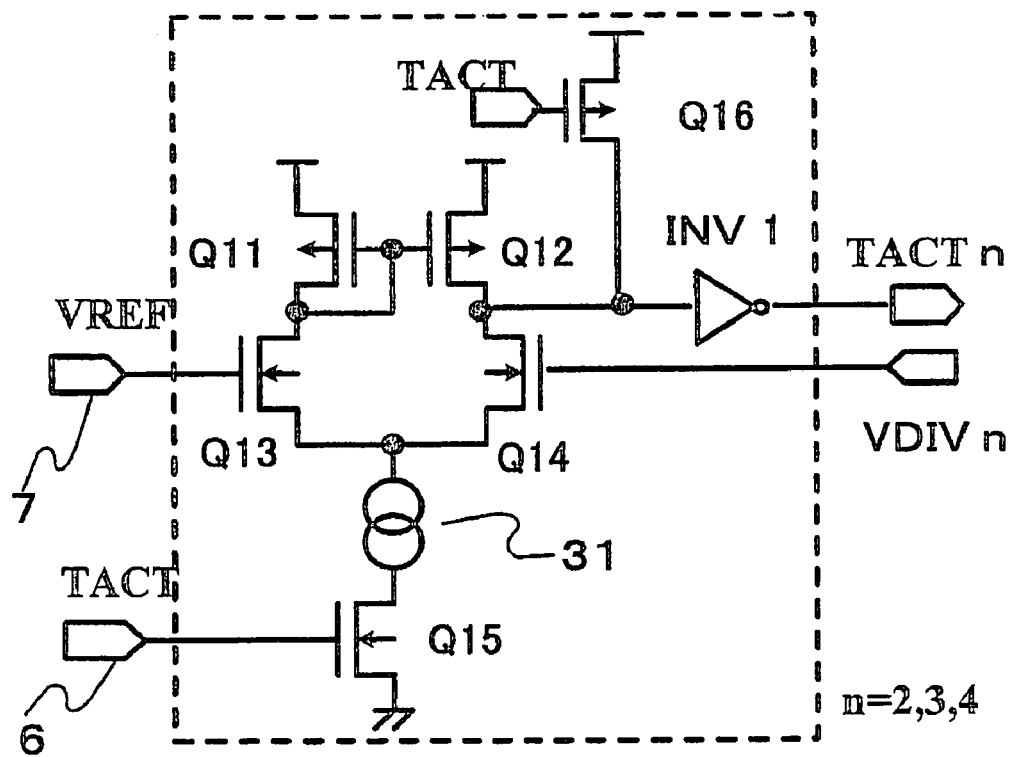
FIG. 3 is a circuit diagram of second comparison unit.
Figure 4:
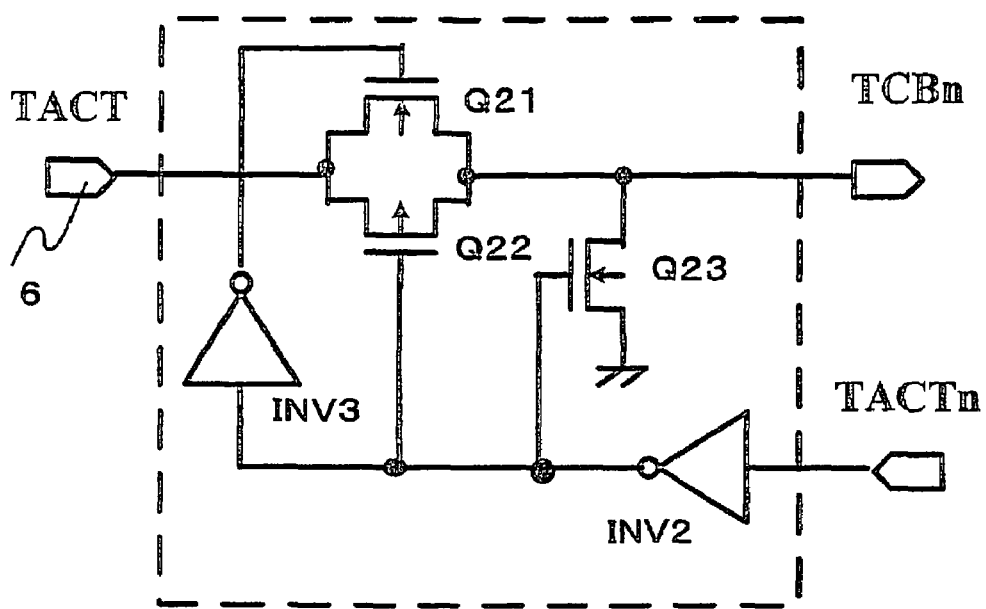
FIG. 4 is a circuit diagram illustrating a changeover device for changing over a clock buffer control signal.
Figure 5:
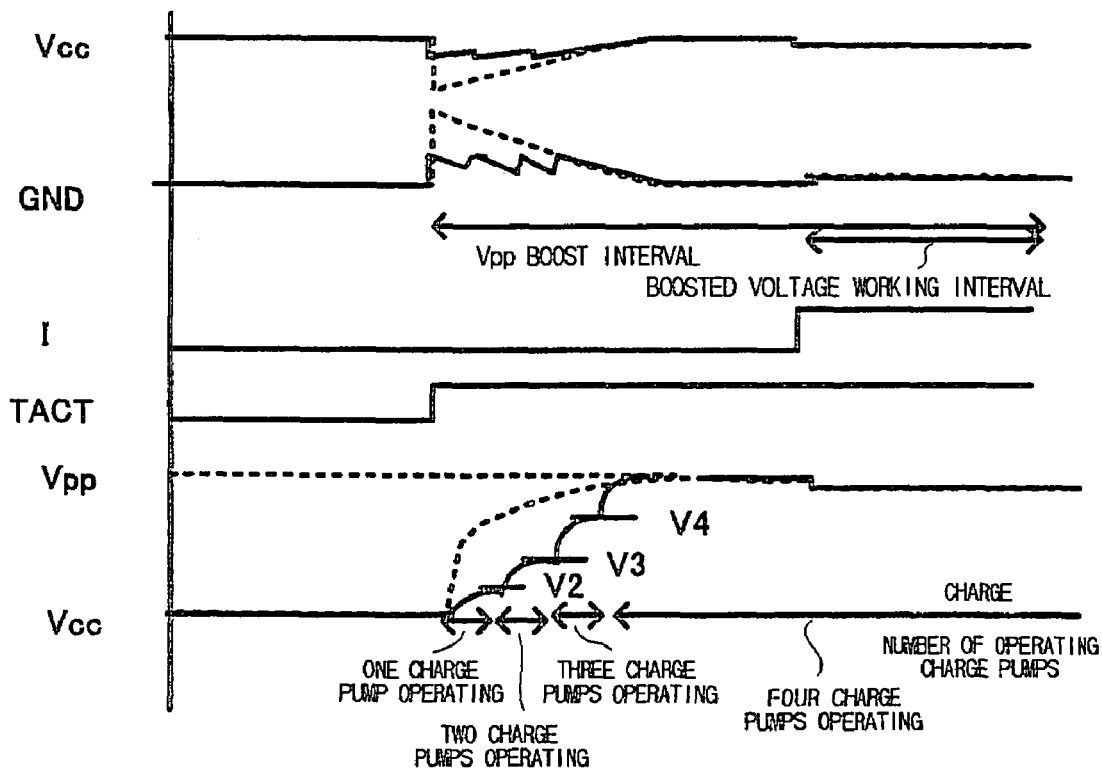
FIG. 5 is a timing chart illustrating operation of the booster circuit.

FIG. 1 is a circuit block diagram illustrating a booster circuit according to a first embodiment of the prior art, FIG. 2 is a circuit diagram of first comparison unit, FIG. 3 is a circuit diagram of second comparison unit, FIG. 4 is a circuit diagram illustrating a changeover device for changing over a clock buffer control signal, and FIG. 5 is a timing chart illustrating operation.

The booster circuit shown in FIG. 1 comprises charge pump units 1 having a clock buffer #1 and a charge pump circuit #1; charge pump unit 2, 3 and 4 similarly having clock buffers #2, #3 and #4 and charge pump circuits #2, #3 and #4, respectively; a clock generating circuit 5 for generating a basic clock 51 and clocks 52, 53 and 54 each of which is shifted in phase relative to the basic clock; a capacitor 8; voltage dividing unit 19 for dividing a boosted voltage; comparison units 10, 12, 13 and 14; and control signal changeover devices 22, 23 and 24. The booster circuit has an input terminal 6 to which a booster circuit activating signal TACT is input, a terminal 7 to which a reference voltage VREF is input, and an output terminal 9 for outputting a boosted voltage Vpp. The booster circuit supplies the boosted voltage and current to a load 20.

The charge pump unit 1 includes the clock buffer #1 to which the booster circuit activating signal TACT and the clock pulse 51 from the clock generating circuit 5 are input and which supplies its output to the charge pump circuit #1, and the charge pump circuit #1 to which the output of the clock buffer #1 is input and which supplies its output to the output terminal 9.

The charge pump unit 2 includes the clock buffer #2 to which a clock buffer control signal TCB2 from the control signal changeover device 22 and the clock pulse 52 from the clock generating circuit 5 are input and which supplies its output to the charge pump circuit #2, and the charge pump circuit #2 to which the output of the clock buffer #2 is input and which supplies its output to the output terminal 9.

The charge pump unit 3 and 4 have a structure similar to that of the charge pump unit 2. Clock pulses 53, 54 from the clock generating circuit 5 and clock buffer control signals TCB3, TCB4 from the control signal changeover devices 23, 24 are input to the charge pump units 3 and 4, respectively, and the clock buffers #3, #4 and charge pump circuits #3, #4 operate in a manner similar to that of the clock buffer #2 and charge pump circuit #2.

The booster circuit activating signal TACT and a clock generation control signal TOSC from the comparison unit 10 are input to the clock generating circuit 5, which outputs clock pulses 51, 52, 53 and 54. The capacitor 8, which is connected to the output terminal 9, smooths the boosted voltage Vpp and supplies the boosted voltage Vpp and a current I to the booster circuit load 20, which is located within a semiconductor device, from the output terminal 9.

Division using a plurality of resistors or division using a plurality of transistors may be employed in the voltage dividing unit 19 that divides the boosted voltage Vpp. In the description of the present invention, however, use is made of division by resistors as an example.

One voltage dividing group, which is constituted by resistors R11, R12, R13, R14 and R15 connected serially between the boosted voltage and ground voltage, outputs a divided boosted voltage VDIVO from the node between resistors R14 and R15. Similarly, other groups of resistors are composed of resistors R21, R22, R23, R24 and R25, resistors R31, R32, R33, R34 and R35 and resistors R41, R42, R43, R44 and R45, although some of these other resistors are not illustrated. In respective ones of these resistor groups, a divided boosted voltage VDIV2 is output from a node between resistors R21 and R22, a divided boosted voltage VDIV3 is output from a node between resistors R32 and R33, and a divided boosted voltage VDIV4 is output from a node between resistors R43 and R44.

These divided boosted voltages are all smaller than the reference voltage VREF if the output voltage of the booster circuit is lower than a power supply voltage Vcc. Assume that the divided boosted voltages and reference voltage are related as follows: VREF>VDIV2>VDIV3>VDIV4>VDIV0.

The booster circuit activating signal TACT and the reference voltage VREF are input to each of the comparison units 10, 12, 13 and 14. The comparison unit 10 compares the entered reference voltage VREF and the divided boosted voltage VDIV0 and outputs the clock generation control signal TOSC. The comparison unit 12 compares the entered reference voltage VREF and the divided boosted voltage VDIV2 and outputs a charge pump control signal TACT2.

The comparison unit 13 compares the entered reference voltage VREF and the divided boosted voltage VDIV3 and outputs a charge pump control signal TACT3. The comparison unit 14 compares the entered reference voltage VREF and the divided boosted voltage VDIV4 and outputs a charge pump control signal TACT4.

The control signal changeover devices 22, 23 and 24 are changed over by the charge pump control signals TACT2, TACT3 and TACT4, respectively, and output clock buffer control signals TCB2, TCB3 and TCB4 to the clock buffers #2, #3 and #4, respectively.

The above-mentioned comparison units and control signal changeover devices will be described with reference to FIGS. 2, 3 and 4. An example of the structure of the comparison unit 10 is illustrated in the circuit diagram of FIG. 2. The comparison unit 10 compares the divided boosted voltage VDIV0 and the reference voltage VREF and outputs the clock generation control signal TOSC.

A transistor Q11 has a source connected to the power supply voltage and a gate and drain that are tied together. A transistor Q12, which has a source connected to the power supply voltage, a gate connected to the gate of transistor Q11 and a drain connected to an output of the comparison unit, outputs the clock generation control signal TOSC. A transistor Q13 has a drain connected to the drain of transistor Q11, a gate connected to the reference voltage VREF and a source connected to the source of a transistor Q14 and to one end of a constant current source 31.

The transistor Q14 has a drain connected to the drain of transistor Q12, a gate connected to the divided boosted voltage VDIV0 and a source connected to the source of transistor Q13 and to one end of the constant current source 31. The constant current source 31 has this one end connected to the sources of transistors Q13, Q14 and has its other end connected to the drain of a transistor Q15. The latter has its drain connected to the terminal of the constant current source 31, a gate connected to the booster circuit activating signal TACT and a source connected to ground voltage.

The comparison unit 10 compares the reference voltage VREF and the divided boosted voltage VDIV0 and outputs the clock generation control signal TOSC, thereby controlling the operation of the clock generating circuit. This operation will be described below. If the booster circuit activating signal TACT is in the deactivated state (the low level), the clock generating circuit 5 does not generate a clock pulse. If the booster circuit activating signal TACT is in the activated state (the high level), then the comparison unit 10 compares the reference voltage VREF and the divided boosted voltage VDIV0.

If the divided boosted voltage VDIV0 is less than the reference voltage VREF, the clock generation control signal TOSC attains the high level, the clock generating circuit 5 generates a clock pulse 51 and the charge pump unit 1 performs the voltage boosting operation. If the divided boosted voltage VDIV0 is greater than the reference voltage VREF, then the clock generation control signal TOSC assumes the low level, the clock generating circuit 5 does not generate the clock pulse 51 and the charge pump unit 1 does not perform the voltage boosting operation.

The settings are such that when the booster circuit is activated, the charge pump unit starts operating and the output of the booster circuit attains the desired boosted voltage Vpp, VDIV0 and VREF become equal. When the output of the booster circuit exceeds the desired Vpp level, the divided boosted voltage VDIV0 becomes greater than the reference voltage VREF. As a result, the clock pulse 51 is not generated and the boosting operation ceases. When the boosting operation stops, the level of output of the booster circuit declines owing to the booster circuit load and eventually falls below the desired boosted voltage level Vpp. Since the divided boosted voltage VDIV0 becomes smaller than the reference voltage VREF in this case, the clock pulse 51 is generated by the clock generating circuit 5 and the booster circuit resumes the boosting operation. When the level of the booster circuit output rises, the desired Vpp level is attained and then this level is exceeded, the boosting operation is halted by the comparison unit 10. By repeating this operation, the booster circuit continues to be controlled in the vicinity of desired Vpp level.

The comparison units 12, 13 and 14 will be described with reference to FIG. 3. These comparison units differ from the comparison unit 10 in the divided boosted voltage input thereto and in that an inverter circuit INV1 and transistor Q16 are additionally provided as output-related structure. Other structural elements are the same as those of the comparison unit 10 and only the aspects that differ will be described.

The divided boosted voltage VDIVn (VDIV2, VDIV3, VDIV4) is input to the gate of transistor Q14. An additionally provided transistor Q16 has a source connected to the power supply voltage, a gate connected to the booster circuit activating signal TACT and a drain connected to the drain of transistor Q12. The drain of transistor Q12 is an input to the inverter circuit INV1, which outputs the charge pump control signal TACTn (TACT2, TACT3, TACT4) as its output signal.

These comparison units 12, 13 and 14 each compare the respective ones of the divided boosted voltages and the reference voltage and output the results of the comparison to the control signal changeover devices as the charge pump control signal TACTn (TACT2, TACT3 and TACT4), respectively. This operation will be described below. If the booster circuit activating signal TACT is in the deactivated state (the low level), the transistor Q15 assumes the off state and the charge pump control signal TACTn (TACT2, TACT3, TACT4), which is the output of the comparison units, assumes the low level. If the booster circuit activating signal TACT is in the activated state (the high level), then the reference voltage VREF and the divided boosted voltage VDIVn (VDIV2, VDIV3, VDIV4) is compared. If the divided boosted voltage VDIVn (VDIV2, VDIV3, VDIV4) is less than the reference voltage VREF, then the charge pump control signal TACTn (TACT2, TACT3, TACT4) assumes the low level. If the divided boosted voltage VDIVn (VDIV2, VDIV3, VDIV4) is greater than the reference voltage VREF, then the charge pump control signal TACTn (TACT2, TACT3, TACT4) assumes the high level.

The control signal changeover devices 22, 23 and 24 will be described with reference to FIG. 4. By changing over the booster circuit activating signal TACT to the charge pump control signal TACTn (n=2, 3, 4), the control signal changeover device outputs a clock buffer activating signal TCBn (n=2, 3, 4), thereby controlling the corresponding charge pump unit.

The control signal changeover device comprises an inverter INV2 to which the charge pump control signal TACTn is input for outputting a signal that is the inverse of this signal; an inverter circuit INV3 to which the output of the inverter circuit INV2 is input for outputting a signal that is the inverse of this signal; a transistor Q22 having a gate to which the output of the inverter circuit INV2 is output, a source to which the booster circuit activating signal TACT is input and a drain from which the clock buffer control signal TCBn is output; a transistor Q21 having a gate to which the output of the inverter circuit INV3 is output, a drain to which the booster circuit activating signal TACT is input and a source from which the clock buffer control signal TCBn is output; and a transistor Q23 having a drain connected to the clock buffer control signal TCBn, a source connected to the ground voltage and a gate connected to the output of the inverter circuit INV2.

If the charge pump control signal TACTn is at the high level and therefore in the activated state, the control signal changeover device outputs the booster circuit activating signal TACT as the clock buffer control signal TCBn and actuates the charge pump unit. If the charge pump control signal TACTn is at the low level and therefore in the deactivated state, the control signal changeover device outputs the low level as the clock buffer control signal TCBn and does not actuate the charge pump unit.

Operation will be described in greater detail with reference to FIG. 5. If the booster circuit activating signal TACT is in the deactivated state (the low level, the comparison unit 10 outputs the high level as the clock generation control signal TOSC and the clock generating circuit does not generate a clock pulse. The comparison units 12, 13 and 14 output low-level signals as the charge pump control signals TACT2, TACT3 and TACT4, respectively, and the booster circuit activating signal TACT is not transmitted to the clock buffers. The clock buffers, therefore, do not operate. Accordingly, the booster circuit is in the deactivated state and does not perform the boosting operation. If the booster circuit is in the deactivated state, the boosted voltage is charged up by the power supply voltage within the charge pump circuit and becomes the usual power supply voltage Vcc.

When the booster circuit activating signal TACT attains the activated state (the high level) and the booster circuit has started up, the output voltage of the booster circuit is the power supply voltage Vcc. In this case, the divided boosted voltages VDIV0, VDIV2, VDIV3 and VDIV4 obtained by division by resistors are voltages smaller than the reference voltage VREF. As a result, the output of the comparison unit 10 is at the high level and the other comparison units 12, 13 and 14 output the low level. The clock generating circuit generates a clock pulse in response to the clock generation control signal TOSC, which is the output of the comparison unit 10, and the charge pump unit 1 starts the boosting operation.

The charge pump control signal TACTn of the comparison units 12, 13 and 14 is at the low level and the control signal changeover devices 22, 23 and 24 do not transmit the booster circuit activating signal TACT to the clock buffers #2, #3 and #4. As a result, the charge pump units 2, 3 and 4 do not perform the boosting operation and only the single charge pump unit 1 starts the boosting operation. Accordingly, the charge pump unit (circuit) that operates is only one and fluctuation of the power supply voltage is small.

Next, when voltage is boosted further and output terminal 9 attains a boosted voltage V2, the divided boosted voltage VDIV2 resulting from division by the resistors R21, R22, R23, R24 and R25 (reference numerals omitted in FIG. 1) becomes greater than the reference voltage VREF and the remaining outputs VDIV0, VDIV3, VDIV4 obtained by division by the resistors exhibit voltages that are less than the reference voltage VREF. Consequently, the charge pump control signal TACT2 from the comparison unit 12 attains the high level, the control signal changeover device 22 transmits the booster circuit activating signal TACT to clock buffer #2 of the charge pump unit 2 and the charge pump unit 2 starts the boosting operation. At this time, therefore, two charge pump units, namely the charge pump units 1 and 2, perform the boosting operation. Since the charge pump circuit that starts operating at this time is a single charge pump circuit, the increase in consumed current at start-up is equivalent to that of this single charge pump circuit and fluctuation of the power supply voltage is suppressed.

When voltage is boosted further and output terminal 9 attains a boosted voltage V3, the divided boosted voltage VDIV3 resulting from division by the resistors R31, R32, R33, R34 and R35 (reference numerals omitted in FIG. 1) becomes greater than the reference voltage VREF and the remaining outputs VDIV0, VDIV4 obtained by division by the resistors exhibit voltages that are less than the reference voltage VREF. Consequently, the charge pump control signal TACT3 from the comparison unit 13 attains the high level, the control signal changeover device 23 transmits the booster circuit activating signal to clock buffer #3 of the charge pump unit 3 and the charge pump unit 3 starts the boosting operation. At this time, therefore, three charge pump units, namely the charge pump units 1, 2 and 3, perform the boosting operation. Since the charge pump unit (circuit) that starts operating at this time is a single charge pump circuit, the increase in consumed current at start-up is equivalent to that of this single charge pump circuit and fluctuation of the power supply voltage is suppressed.

When voltage is boosted further and output terminal 9 attains a boosted voltage V4, the divided boosted voltage VDIV4 resulting from division by the resistors R41, R42, R43, R44 and R45 becomes greater than the reference voltage VREF. As a result, the charge pump control signal TACT4 from the comparison unit 14 attains the high level, the control signal changeover device 24 transmits the booster circuit activating signal to clock buffer #4 of the charge pump unit 4 and the charge pump unit 4 starts the boosting operation. Accordingly, all four of the charge pump units 1, 2, 3 and 4 now perform the boosting operation. Since the charge pump circuit that starts operating at this time is a single charge pump unit (circuit), the increase in consumed current at start-up is equivalent to that of this single charge pump circuit and fluctuation of the power supply voltage is suppressed.

When all of the charge pump units perform boosting and voltage is boosted to the desired boosted voltage Vpp, the divided boosted voltage VDIV0 becomes larger than the reference voltage VREF, the comparison output of the comparison unit 10 is inverted, the clock generating circuit 5 stops generating the clock and the boosting operation is halted. On the other hand, when the boosted voltage Vpp and current I start being supplied to the booster circuit load internally of the semiconductor device, the boosted voltage declines, the divided boosted voltage VDIV0 becomes smaller than the reference voltage VREF, clock pulses are generated again and the boosting operation is resumed. The boosted voltage is controlled to within the vicinity of the desired VPP level by repeating this operation. Further, the consumed current when each of the booster circuits resumes the boosting operation is different from that at start-up, i.e., is smaller. As a consequence, there is no large fluctuation in the power supply voltage.

Accordingly, if the booster circuit activating signal TACT is activated (raised to the high level), clock pulses are generated by the clock generating circuit and boosting starts being performed by only one charge pump unit, namely the charge pump unit 1. The voltage boosted by the charge pump unit 1 becomes V2, the boosting operation starts being performed by the second charge pump unit 2 and, hence, boosting is performed by two charge pump units. When the boosted voltage rises further to V3, the charge pump unit 3 starts boosting and, hence, boosting is performed by three charge pump units. When the boosted voltage rises further to V4, the charge pump unit 4 starts boosting and, hence, all four of the charge pump units perform the boosting operation.

Thus, boosted voltage is monitored and the number of parallel-connected charge pump units operating is increased successively to one, two three and four in dependence upon the boosted voltage. By thus monitoring boosted voltage and incrementing the number of charge pump units that start operating in accordance with the boosted voltage, the peak consumption current at start-up is made that equivalent to a single charge pump unit, fluctuation of the power supply voltage can be reduced and it becomes possible for the internal operation of the semiconductor device to be performed reliably.

By virtue of the charge pump control means comprising the voltage dividing means and comparison means, the number of operating charge pump means that perform the boosting operation is controlled by the charge pump control signal generated by the comparison means, which compares the divided boosted voltage from the voltage dividing means with the reference voltage.

When the boosted voltage is low, boosting is performed by a small number of the charge pump means. As the boosted voltage rises, boosting is performed by charge pump means the number of which is larger than that when the boosted voltage was low, as a result of which the peak current at start-up and fluctuation of the power supply voltage are suppressed.

For reference purposes, the dashed lines in FIG. 5 indicate a case where a plurality of the charge pump circuits (units) are started up simultaneously (or at short time intervals). In such case the peak current at start-up is large. This has an adverse effect upon the operation of the circuitry within the semiconductor device. In the present invention, the number of charge pump units that operate in a case where the boosted voltage value is high differs from that when the boosted voltage value is low. This means that the slope of the voltage boosted in a case where the boosted voltage value is high differs from that when the boosted voltage value is low. The slope of the voltage is small if the boosted voltage value is low and is large if the boosted voltage value is high.

In the present invention, boosted voltage is monitored and the plurality of parallel-connected charge pump means (units) are activated successively in accordance with the boosted voltage. Thus, there is obtained a booster circuit in which activating charge pump means (units) successively in dependence upon the boosted voltage suppresses peak consumption current of the booster circuit and assures that consumed current with respect to boosted voltage will be efficient.

Second Embodiment

Figure 6:
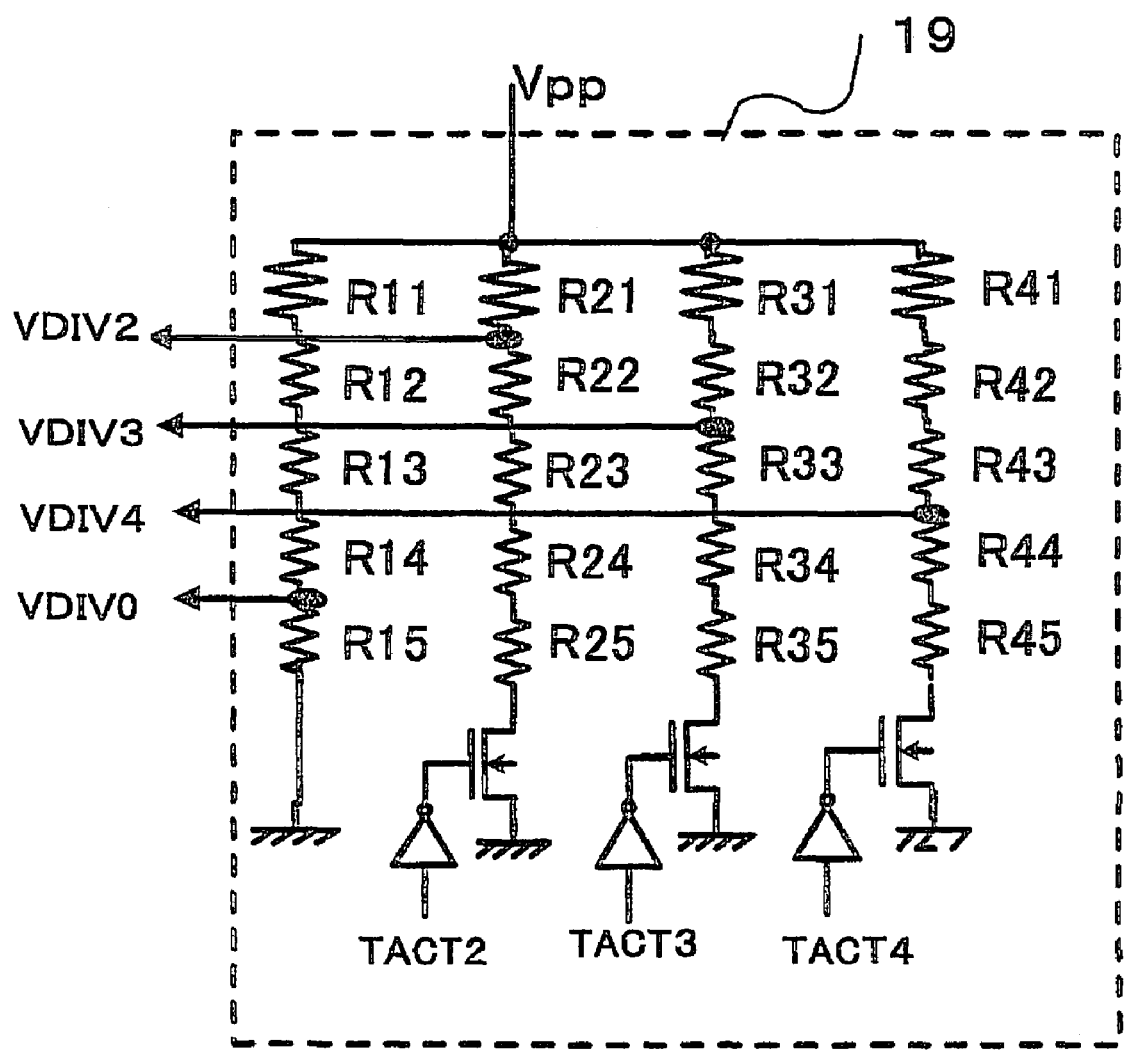
FIG. 6 is a circuit diagram of a circuit for dividing boosted voltage according to a second embodiment of the present invention.

FIG. 6 illustrates the circuit structure of second voltage dividing unit for dividing boosted voltage in a second embodiment of the present invention. In the second embodiment, the voltage dividing unit of the first embodiment for dividing boosted voltage and outputting the divided boosted voltage is modified to have the structure shown in FIG. 6. This embodiment is such that when the boosted voltage has declined owing to supply of current to the load of the booster circuit, a charge pump unit, once it has starting the boosting operation, is prevented from suspending the boosting operation and is allowed to continue performing boosting.

In comparison with the voltage dividing unit 19 for dividing boosted voltage in FIG. 1, it will be understood that the voltage dividing unit of this embodiment differs in that the second, third and fourth resistor groups are each additionally provided with a transistor and an inverter. Structural elements identical with those of FIG. 1 are designated by like reference characters and need not be described again. The second resistor group, which outputs the divided boosted voltage VDIV2, has the transistor inserted between ground voltage and the resistor R25. The transistor has a drain connected to one end of the resistor R25, a source connected to ground voltage and a gate to which is input a signal that is the inverse of the charge pump control signal TACT2, which is the output of the comparison unit 12. Similarly, the third resistor group has the transistor inserted between the resistor R35 and ground voltage, and the input to the gate of this transistor is a signal that is the inverse of the charge pump control signal TACT3. The fourth resistor group likewise has the transistor inserted between the resistor R45 and ground voltage, and the input to the gate of this transistor is a signal that is the inverse of the charge pump control signal TACT4.

In a case where the booster circuit activating signal TACT is in the deactivated state (the low level), the charge pump control signals TACT2, TACT3, TACT4 are all at the low level, the inverted signals thereof are at the high level, the respective ones of the transistors are in the ON state and the divided boosted voltages VDIV2, VDIV3, VDIV4 are input to respective ones of the comparison units. These operations are similar to those of the first embodiment and the charge pump circuits do not perform the boosting operation.

In a case where the booster circuit activating signal TACT is in the activated state (the high level), operation differs depending upon the voltage of the boosted voltage. In a case where the boosted voltage Vpp has a low voltage level in the vicinity of the power supply voltage, the divided boosted voltages VDIV0, VDIV2, VDIV3, VDIV4 are smaller than the reference voltage VREF, only the comparison unit 10 is in the activated state, clock pulses are generated in response to the clock generation control signal TOSC from the comparison unit 10 and only the charge pump unit 1 performs the boosting operation.

If the boosted voltage is greater than V2 and less than V3, the divided boosted voltage VDIV2 exceeds the reference voltage VREF, the charge pump control signal TACT2 from the comparison unit 12 attains the high level, the charge pump control signals TACT2, TACT3 are output at the low level, the charge pump unit 2 starts the boosting operation and the charge pump unit 3 and 4 do not operate. At this time the transistor of the second resistor group assumes the off state and the boosted voltage per is output as divided boosted voltage VDIV2. The transistors of the third and fourth resistor groups remain in the on state and the divided boosted voltages VDIV3, VDIV4 are output.

If the boosted voltage is greater than V3 and less than V4, the divided boosted voltage VDIV2 exceeds the reference voltage VREF, the charge pump control signal TACT3 from the comparison unit 13 attains the high level, the charge pump control signal TACT4 is output at the low level, the charge pump unit 3 starts the boosting operation and the charge pump unit 4 does not operate. At this time the transistor of the third resistor group assumes the off state and the boosted voltage per se is output as divided boosted voltage VDIV3. The transistor of the fourth resistor group remains in the ON state and the divided boosted voltage VDIV4 is output.

If the boosted voltage exceeds V4, the divided boosted voltage VDIV4 becomes larger than the reference voltage VREF, the charge pump control signal TACT4 from the comparison unit 14 attains the high level, the charge pump unit 4 also starts the boosting operation and, hence, the charge pump units 2, 3 and 4 all perform the boosting operation. At this time the transistor of the fourth resistor group assumes the assume state and the boosted voltage itself is output as the divided boosted voltage.

If the boosted voltage is boosted further to the desired boosted voltage Vpp, then the divided boosted voltage VDIV0 surpasses the reference voltage VREF, the clock generation control signal from the comparison unit 10 is deactivated and the clock generating circuit stops generating clock pulses. These operations are similar to those of the first embodiment.

Thus, when the boosted voltage reaches a specific voltage, the charge pump control signal TACTn is activated and attains the high level, the transistor of the applicable potential dividing unit assumes the off state and the boosted voltage per se is output as the divided boosted voltage. Accordingly, once activated, the charge pump control signal TACTn is maintained in this state. The charge pump control signal TACTn continues to be held in the activated state until the booster circuit activating signal TACT reverts to the deactivated state (the low level).

Adopting such an arrangement is advantageous in that there is obtained a booster circuit in which all four of the charge pump units will be in the voltage boosting state even if the boosted voltage falls below the level of V4 as the internal circuitry of the semiconductor device operates and current is supplied from the booster circuit. As a result, recovery of boosted voltage can be achieved quickly and the load of the booster circuit can be supplied with a stable current.

In the second embodiment, boosted voltage is monitored, the charge pump control signal TACTn is activated in accordance with the boosted voltage and the plurality of parallel-connected charge pump units are activated one after another. The activated charge pump control signal TACTn remains in the activated state until the next booster-circuit activating signal is deactivated. Thus there is obtained a booster circuit in which peak consumption current of the booster circuit is suppressed, consumed current with respect to the boosted voltage is efficient and a stable current can be supplied to the load of the booster circuit.

Third Embodiment

Figure 7:
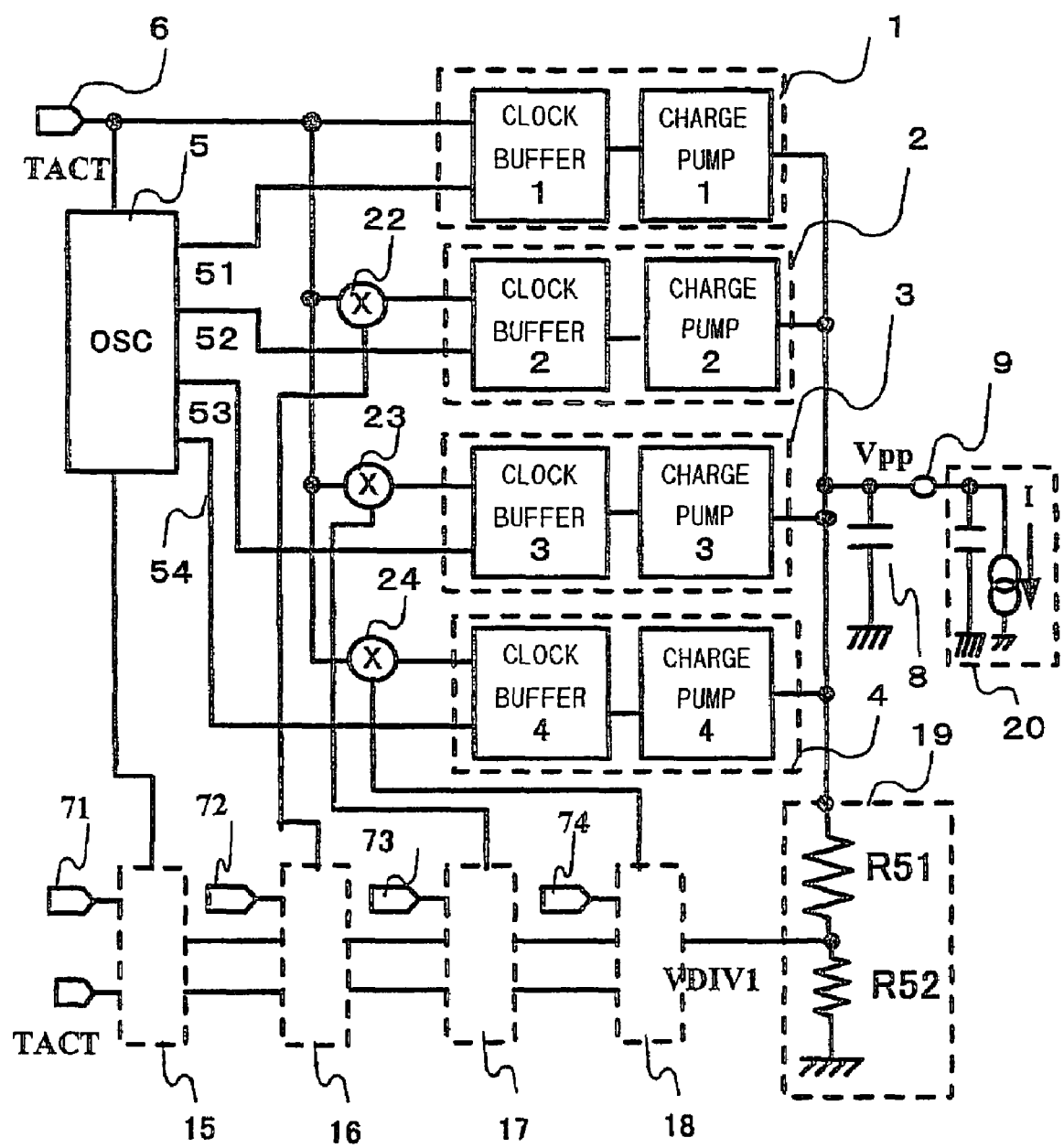
FIG. 7 is a circuit block diagram illustrating a booster circuit according to a third embodiment of the present invention.
Figure 8:
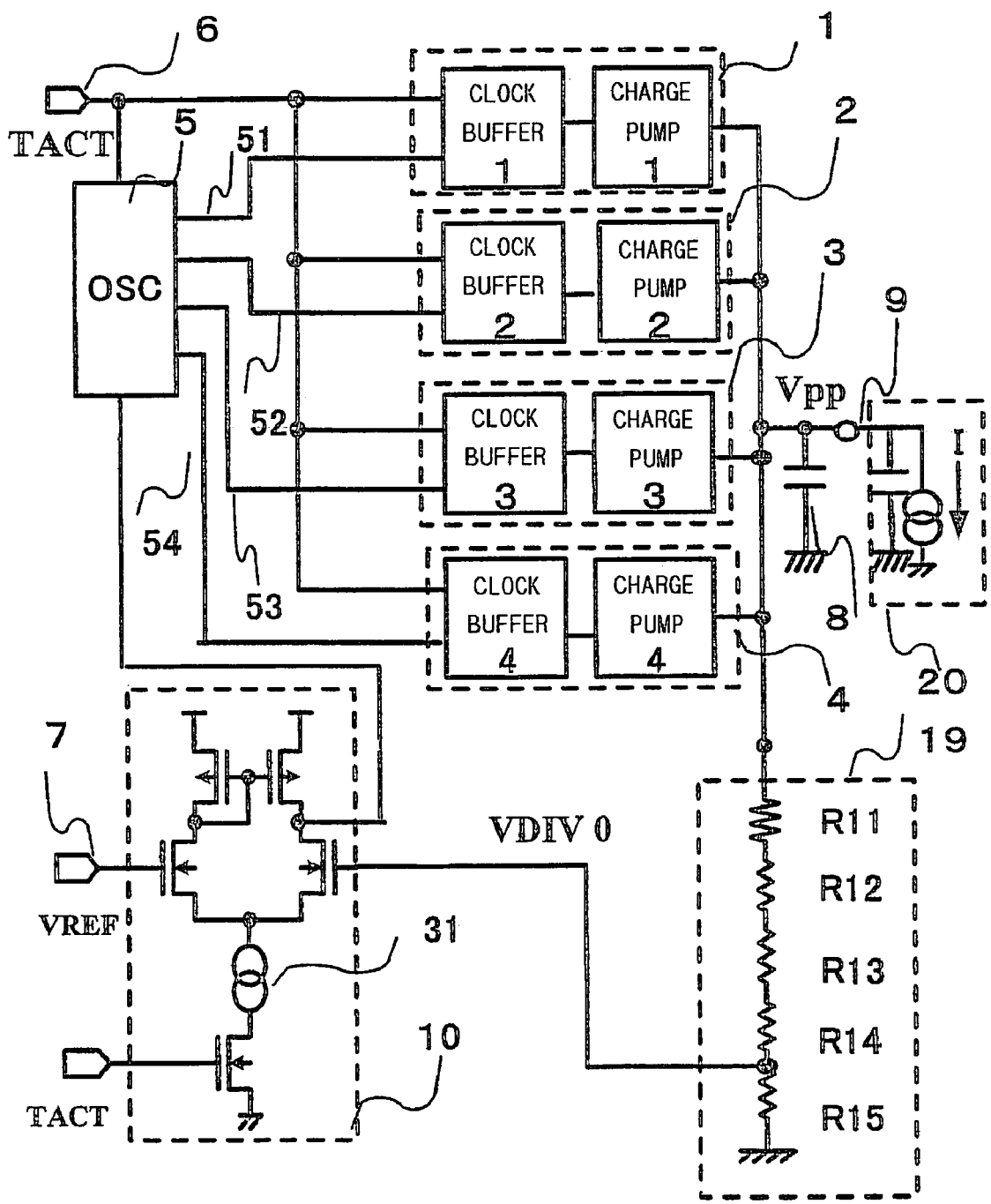
FIG. 8 is a circuit block diagram illustrating an example of the prior art.

FIG. 7 illustrates a third embodiment of the present invention. The embodiment in FIG. 7 differs in the arrangement of the comparison units and voltage dividing units that outputs divided boosted voltage. Structural elements identical with those in FIG. 1 are designated by like reference characters and need not be described again. The voltage dividing unit for outputting divided boosted voltage comprises resistors R51 and R52, with divided boosted voltage VDIV1 being output from the node of resistors R51 and R52. Comparison units 15, 16, 17 and 18 compare the commonly applied divided boosted voltage with different reference voltages 71 to 74, and output clock generation control signals or charge pump control signals.

In the comparison means of the first embodiment shown in FIG. 1, a common reference voltage is applied to these comparison units, which compare the reference voltage with respective ones, respectively, of divided boosted voltages having voltage values that differ from one another. In the third embodiment, however, the same divided boosted voltage is applied commonly to the comparison units, and these comparison units compare this divided boosted voltage with respective ones of reference voltages having voltage values that differ from one another. The circuit arrangement of the comparison units is the same as that in FIGS. 2 and 3 and only the voltage input thereto differs.

The comparison unit 15 has a structure identical with that of the comparison unit 10 in the first embodiment, and a reference voltage 71 is input instead of the reference voltage VREF.

The comparison units 16, 17 and 18 are structurally identical with the comparison units 12, 13 and 14 in the first embodiment, and reference voltages 72, 73 and 74, respectively, are input instead of the reference voltage VREF.

By setting the voltage values so as to satisfy, for instance, the following relationship: reference voltage 71>reference voltage 74>reference voltage 73>reference voltage 72, a boosting operation similar to that of the first embodiment can be carried out. If the booster circuit activating signal TACT is at the low level, no boosting is performed. If the booster circuit activating signal TACT is at the high level, first the divided boosted voltage VDIV1 is compared with the reference voltages 71, 74, 73 and 72. If the divided boosted voltage VDIV1 is smaller, the clock generation control signal TOSC from the comparison unit 15 attains the high level, the charge pump unit 1 performs the boosting operation and the other charge pump units 2, 3 and 4 do not perform boosting.

When the divided boosted voltage VDIV1 surpasses the reference voltage 72, the charge pump control signal TACT2 from the comparison unit 16 is activated and the charge pump unit 2 starts the boosting operation. When the divided boosted voltage VDIV1 surpasses the reference voltage 73, the charge pump control signal TACT3 from the comparison unit 17 is activated and the charge pump unit 3 starts the boosting operation. When the divided boosted voltage VDIV1 surpasses the reference voltage 74, the charge pump control signal TACT4 from the comparison unit 18 is activated and the charge pump unit 4 starts the boosting operation. When the divided boosted voltage VDIV1 surpasses the reference voltage 71, the clock generation control signal TOSC from the comparison unit 15 is deactivated and the clock generating circuit 5 stops generating clock pulses.

By adopting the reference voltage 71 as the divided boosted voltage of the desired boosted voltage Vpp and setting the reference voltages 72, 73 and 74 to divided boosted voltages V2(R52/R51+R52), V3(R52/R51+R52) and V4(R52/R51+R52) corresponding to the above-mentioned boosted voltages V2, V3 and V4, it is possible to achieve correspondence with the boosted voltages of the first embodiment. With a boosted voltage that is a voltage in the vicinity of the power supply voltage, one charge pump unit, namely the charge pump unit 1, starts operating in response to the activated signal from the comparison unit 15. At the boosted voltage V2, the charge pump unit 2 starts operating as the second charge pump unit; at the boosted voltage V3, the charge pump unit 3 starts operating as the third charge pump unit; and at the boosted voltage V4, the charge pump unit 4 starts operating as the fourth charge pump unit and each of the charge pump units starts boosting. These operations are similar to those of the first embodiment.

In this embodiment also the boosting operation is started only by the single charge pump unit 1 at the beginning when the booster circuit activating signal TACT has been activated (raised to the high level). The voltage boosted by the charge pump unit 1 becomes V2, the second charge pump unit 2 starts boosting and thus the boosting operation is performed by two charge pump units. When the boosted voltage becomes V3, the third charge pump unit 3 starts boosting and thus the boosting operation is performed by three charge pump units. When the boosted voltage becomes V4, the fourth charge pump unit 4 starts boosting and thus the boosting operation is performed by all four of the charge pump units.

Thus, boosted voltage is monitored, the plurality of parallel-connected charge pump units are activated successively in accordance with the boosted voltage so that one, two, three and then four charge pump units are activated. By thus monitoring boosted voltage and incrementing the number of operating charge pump units in dependence upon the boosted voltage, peak consumption current of the booster circuit is suppressed, fluctuation of power supply voltage can be reduced and internal operation of the semiconductor device can be performed reliably.

The present invention has been described in detail based upon the embodiments. However, it goes without saying that the present invention is not limited to these embodiments and the gist thereof can be modified in various ways within the scope of the claims. For example, although clock pulses of different phases are used as the clock pulses in the embodiments, identical clock pulses can be used. Further, although the number of charge pump units is four in the embodiments, a larger number of charge pump units can be used as a matter of course.

In the present invention, boosted voltage is monitored and a plurality of parallel-connected charge pump units are activated successively in accordance with the boosted voltage. Thus, there is provided a booster circuit in which by successively activating a plurality of charge pump units in accordance with boosted voltage, peak consumption current of the booster circuit is suppressed and efficiency of consumed current with respect to boosted voltage is improved. Further, by providing a semiconductor device with these booster circuits, peak consumption current at start-up of the booster circuit is suppressed and the device exhibits little fluctuation in power supply voltage.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A booster circuit for boosting an externally supplied voltage, comprising:
   a plurality of parallel-connected charge pump units and a circuit that successively activates the charge pump units in response to an output voltage that is successively boosted by the charge pump units,
   wherein said circuit comprises a plurality of voltage dividers, wherein each of said plurality of voltage dividers, divides the successively boosted output voltage and a plurality of comparison units, wherein each of said plurality of comparison units compares a reference voltage to a respective one of the divided successively boosted output voltages and successively activates said plurality of charge pump units based on the comparison,
   wherein each divider comprises resistors that define the respective one of the divided successively boosted output voltage.

2. The booster circuit according to claim 1, wherein each voltage divider comprises a plurality of resistors connected in series between the output voltage and a transistor that is connected to a ground voltage, said transistor being turned on and off by result of comparison by said comparison units.

3. The booster circuit according to claim 2, wherein said transistor is placed in the off state by the result of the comparison by said comparison units, thereby continuing to activate a respective one of said charge pump units.

4. A semiconductor device comprising the booster circuit set forth in claim 1.

5. A booster circuit for boosting an externally supplied voltage, comprising:
   a plurality of parallel-connected charge pump units;
   a clock generating circuit; and
   a circuit that successively activates the charge pump units in response to an output voltage that is successively boosted by the charge pump units,
   wherein said circuit comprises a plurality of voltage dividers, wherein each of said plurality of voltage dividers, divides the successively boosted output voltage and a plurality of comparison units, wherein each of said plurality of comparison units compares a reference voltage to a respective one of the divided successively boosted output voltages and successively activates said plurality of charge pump units based on the comparison, and
   wherein at least one of said plurality of comparison units controls operation of said clock generating circuit, thereby controlling operation of at least one of said charge pump units among said plurality of charge pump units, and the other comparison units successively activate the other charge pump units.

6. A booster circuit for boosting an externally supplied voltage, comprising:
   a plurality of parallel-connected charge pump units; and
   a charge pump units control unit for controlling the number of the charge pump units that are activated to boost an output voltage, the number of activated charge pump units being controlled in response to the output voltage that is boosted by the charge pump units, wherein said charge pump control unit comprises a plurality of voltage dividers, wherein each of said plurality of voltage dividers, divides the output voltage and a plurality of comparison units, wherein each of said plurality of comparison units compares a reference voltage to a respective one of the divided output voltages and successively activates said plurality of charge pump units based on the comparison, and wherein the each divider comprises a plurality of resistors connected in series between the output voltage and a transistor that is connected to a ground voltage, said transistor being turned on and off as a result of a comparison by said comparison units.

7. The booster circuit according to claim 6, wherein a rate of change over time of the boosted voltage when the boosted voltage is low differs from a rate of change over time of the boosted voltage when the boosted voltage is high.

8. The booster circuit according to claim 7, wherein the rate of change over time of the boosted voltage is less when the boosted voltage is low than when the boosted voltage is high.

9. A semiconductor device comprising the booster circuit set forth in claim 6.

10. The booster circuit according to claim 6, wherein said charge pump control unit senses the output voltage and successively activates said charge pump units as the output voltage increases.

11. A booster circuit for boosting an externally supplied voltage, comprising:

a plurality of parallel-connected charge pump units;

a clock generating circuit;

a charge pump units control unit for controlling the number of the charge pump units that are activated to boost an output voltage, the number of activated charge pump units being controlled in response to the output voltage that is boosted by the charge pump units, wherein said charge pump control unit comprises a plurality of voltage dividers, wherein each of said plurality of voltage dividers, divides the output voltage and a plurality of comparison units, wherein each of said plurality of comparison units compares a reference voltage to a respective one of the divided output voltages and successively activates said plurality of charge pump units based on the comparison, and wherein one of said plurality of comparison units controls operation of said clock generating circuit to control operation of at least one of said charge pump units, and others of said comparison units successively activate others of said charge pump units.

12. A booster circuit for boosting an externally supplied voltage, comprising:

a plurality of parallel-connected charge pump units; and a charge pump units control unit for controlling the charge pump units that are activated to boost an output voltage, the charge pump units being controlled in response to the output voltage that is boosted by the charge pump, wherein said charge pump control unit comprises a plurality of voltage dividers, wherein each of said voltage dividers divides the output voltage, and a plurality of comparison units, wherein each of said plurality of comparison units compares a reference voltage to a respective one of the divided output voltages and successively activates said plurality of charge pump units based on the comparison, and wherein said charge pump units are controlled so that a rate of increase of the output voltage per unit time is less when the output voltage is low than when the output voltage is high.

13. A booster circuit according to claim 12, wherein a number of said charge pump units is more when the output voltage is low than when the output voltage is high.

* * * * *